(12) United States Patent
Marks et al.

(10) Patent No.: US 7,449,509 B2
(45) Date of Patent: Nov. 11, 2008

(54) HOLE TRANSPORT LAYER COMPOSITIONS AND RELATED DIODE DEVICES

(75) Inventors: Tobin J. Marks, Evanston, IL (US); He Yan, Skokie, IL (US); Qinglan Huang, Libertyville, IL (US)

(73) Assignee: Northwestern University, Evanston, IL (US)

( * ) Notice: Subject to any disclaimer, the term of this patent is extended or adjusted under 35 U.S.C. 154(b) by 516 days.

(21) Appl. No.: 11/009,883

(22) Filed: Dec. 10, 2004

(65) Prior Publication Data

US 2005/0147846 A1 Jul. 7, 2005

Related U.S. Application Data

(60) Provisional application No. 60/528,325, filed on Dec. 10, 2003.

(51) Int. Cl.
*C08K 5/544* (2006.01)
*H01L 51/54* (2006.01)

(52) U.S. Cl. .............. 524/188; 524/262; 524/265; 524/267; 528/33; 528/38; 528/43; 428/917; 313/506; 257/40; 257/E51.046; 257/E51.051; 252/500

(58) Field of Classification Search ................ None
See application file for complete search history.

(56) References Cited

U.S. PATENT DOCUMENTS

| | | | |
|---|---|---|---|
| 5,563,424 A | 10/1996 | Yang et al. | |
| 5,834,100 A | 11/1998 | Marks et al. | |
| 5,985,417 A | 11/1999 | Shi et al. | |
| 6,344,284 B1 | 2/2002 | Chou | |
| 6,534,198 B1 * | 3/2003 | Ueno et al. | 428/690 |
| 6,544,670 B1 | 4/2003 | Kitano et al. | |
| 6,558,219 B1 | 5/2003 | Burroughes et al. | |
| 6,887,591 B2 * | 5/2005 | Nukada et al. | 428/690 |
| 2003/0129451 A1 * | 7/2003 | Nukada et al. | 428/690 |
| 2003/0211358 A1 | 11/2003 | Kitano et al. | |

FOREIGN PATENT DOCUMENTS

EP  0861845 A2  9/1998
WO  WO 00/31208 A  6/2000

OTHER PUBLICATIONS

Supplementary European Search Report, EP No. 04817999, Jan. 3, 2007 (1 pg.).

* cited by examiner

*Primary Examiner*—Marie R. Yamnitzky
(74) *Attorney, Agent, or Firm*—Foley & Lardner LLP

(57) ABSTRACT

Hole transport layer compositions comprising a silylated aryl amine and a polymeric component, to enhance performance of an associated electroluminescent device.

17 Claims, 8 Drawing Sheets

HOLE TRANSPORT LAYER COMPOSITIONS AND RELATED DIODE DEVICES

This application claims priority benefit from application Ser. No. 60/528,325 filed Dec. 10, 2003, the entirety of which is incorporated herein by reference.

The United States government has certain rights to this invention pursuant to Grant No. DMR-0076097 from the National Science Foundation to Northwestern University.

BACKGROUND OF THE INVENTION

Impressive scientific and technological progress has recently been achieved in the area of organic light-emitting diodes (OLEDs), motivated by potential applications in a large variety of display technologies. OLEDs are "dual-injection" devices in which holes and electrons are injected from opposite electrodes into an active molecular/macromolecular medium to produce, via exciton decay, light emission. OLED responses are usually evaluated with respect to the following characteristics: luminance—light intensity per unit area, turn-on voltage—voltage required for a device to reach luminance of ~1 $cd/m^2$, and current efficiency—luminance per unit current density. To achieve optimum device performance, it has been thought desirable to have multilayer structures having discrete hole transport layer (HTL), emissive layer (EML), and electron transport layer (ETL) functions. The role of the HTL is not only to maximize hole injection from the anode (usually ITO—tin-doped indium oxide), but also to block efficiency-depleting electron overflow from, and to confine excitons within, the EML. With such multilayer structures, high-performance devices have been realized for small-molecule-based OLEDs fabricated via vacuum deposition. Typical small-molecule HTLs are triarylamine-based materials such as NPB or TPD (FIG. 1), which are known to have appreciable hole-transporting and electron-blocking/exciton-blocking capacity, because of their relatively high-lying LUMO levels and large HOMO-LUMO gaps.

For polymer-based LEDs (PLEDs), while single-layer polymer devices have obvious attractions such as ease of fabrication and large carrier mobilities, their performance is limited by inefficient hole injection from the ITO anode into the HOMO level of the EML polymer, as a result of, among other factors, the ITO work function (4.7 eV) and EML HOMO level (5.3-5.9 eV) mismatch. Compared to its small-molecule counterparts, a multilayer PLED device is far more challenging to fabricate due to the risk of partially dissolving a previous layer while depositing the next in solution casting processes. Examples of conventional PLED HTLs are p-doped conductive polymers such as poly(3,4-ethylenedioxythiophene)poly(styrenesulfonate) (PEDOT-PSS), polyaniline-camphorsulfonic acid (PANI-CSA), and polypyrrole-dodecylbenzene sulfonic acid (Ppy-BDSA). In most cases, these HTL films are cured at high temperatures (~200° C.) after spin-coating, and thus rendered insoluble. These conventional HTLs have been shown to significantly enhance PLED anode hole injection (by increasing the anode work function and smoothing energetic dicontinuities) and device performance.

However, these HTLs also have serious drawbacks such as corrosion of the ITO anode, poor surface energy match with typical aromatic EMLs, and mediating the luminescence-degrading oxidative doping of polyfluorene EMLs. Furthermore, the question still remains as to whether PEDOT-PSS has the magnitude of electron-blocking capacity required for a truly high-performance PLED HTL. In addition to these more conventional conductive polymer HTLs, there has also been intense research activity focused on photo- or thermally crosslinkable and in situ polymerized PLED HTLs. Most of these crosslinkable HTLs require either high temperature baking (150-200° C.) or ultraviolet photochemical processing. Moreover, many of these crosslinked films suffer from microcracking due to volume shrinkage on crosslinking of the materials, which could lead to undesirable leakage currents in the PLED devices.

SUMMARY OF THE INVENTION

Figure 1:
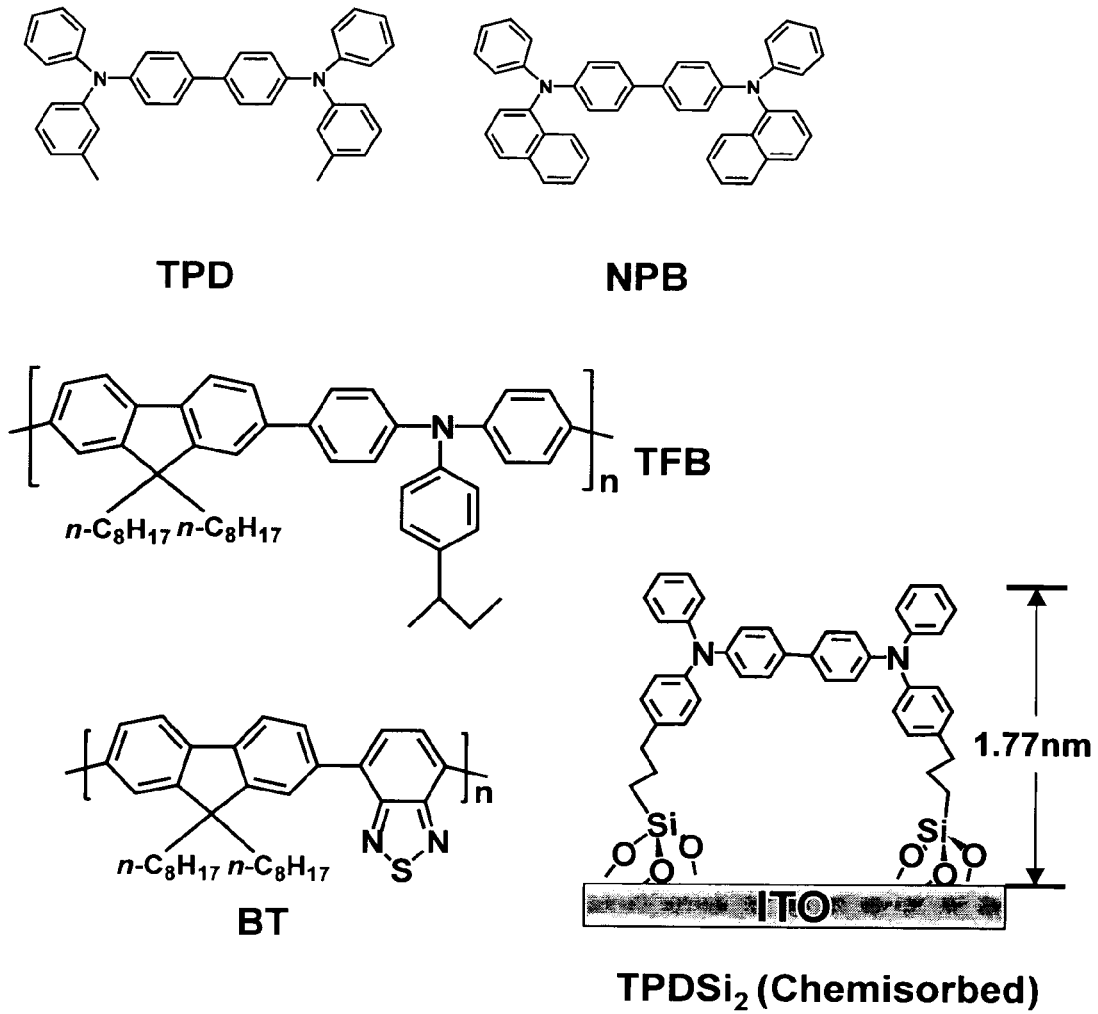
FIG. 1. Chemical structures of small molecules of the prior are and polymer materials currently used to fabricate OLEDs and PLEDs, in accordance with this invention.

In light of the foregoing, it is an object of the present invention to provide hole transport compositions, materials and/or layers, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

It is an object of the present invention to provide a range of hole transport layer compositions, such compositions limited only by the availability of hole transporting silane-derivatized components and hole transporting polymeric components—examples of which are provided herein, the mixture or miscibility thereof one with another, and resulting polymer-incorporated siloxane-bonded matrix/network and corresponding hole transport function.

It is another object of the present invention to provide the aforementioned range of hole transport compositions for use thereof with an available emissive material or conductive layer, compositionally and/or structurally compatible therewith, as contemplated in conjunction with favorable HOMO-LUMO energy level considerations.

It can also be an object of the present invention to provide any one of the range of hole transport layer compositions, as contemplated herein, for incorporation into any electroluminescent device, article or display system using light-emitting diodes.

Other objects, features, benefits and advantages of the present invention will be apparent from this summary and its descriptions of various preferred embodiments, and will be readily apparent to those skilled in the art having knowledge of various electroluminescent devices, components and assembly/production techniques. Such objects, features, benefits and advantages will be apparent from the above as taken into conjunction with accompanying examples, data, figures and all reasonable inferences to be drawn therefrom, alone or with consideration of the references incorporated herein.

In part, the present invention can be directed to a hole transport composition comprising a polymeric hole transport component and a silylated aryl amine component of a formula selected from

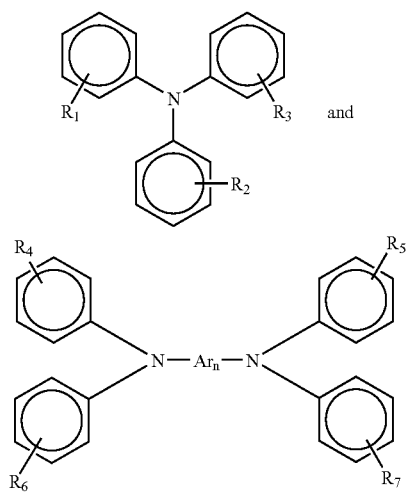

In such compositions, Ar can be arylene, where n can be an integer ranging from 1 to about 4. Substituents $R_1$-$R_7$ can be independently selected from H and alkyl moieties ranging from $C_1$ to about $C_6$, each said moiety comprising a hydrolyzable silyl group. At least one of $R_1$-$R_3$ and at least one of $R_4$-$R_7$ is an alkyl moiety. The range of the hydrolyzable silyl groups will be known by those skilled in the art made aware of this invention, and include but are not limited to groups such as trialkoxysilyl, trihalosilyl, dialkoxyhalosilyl, dialkylhalosilyl, dihaloalkylsilyl and dihaloalkoxysilyl. Such aryl amine components, together with their substituent alkyl moieties and related silyl groups include but are not limited to compounds described more fully in co-pending application Ser. No. 10/924,730 filed Aug. 24, 2004, in particular FIGS. 2A-2G and 11A-11D together with the specification and examples corresponding thereto, and U.S. Pat. No. 5,834,100, issued Nov. 10, 1998, in particular FIGS. 2A-2C together with specification and examples corresponding thereto, each of which is incorporated herein by reference in its entirety.

In certain non-limiting embodiments, at least one of $R_1$-$R_3$ and at least one of $R_4$-$R_7$ can be a $C_2$-$C_4$ alkyl moiety comprising either a terminal trihalosilyl or a trialkoxysilyl group. As discussed more fully herein, such groups are hydrolyzable to a degree sufficient for substrate sorption or condensation or intermolecular crosslinking via siloxane bond formation under the processing or fabrication conditions employed. Regardless, the polymeric component of such compositions can be selected from a range of such polymers otherwise used in the art as separate hole transport and/or emissive layers in OLED fabrication.

Accordingly, this invention can utilize a siloxane crosslinking approach to robust, efficient, adherent HTLs for PLEDs. Certain embodiments, for example, can employ 4,4'-bis[(p-trichlorosilylpropylphenyl) phenylamino]biphenyl (i.e., $TPDSi_2$ or e.g., the corresponding monosilylated, i.e., TPDSi, and trisilylated, i.e., $TPDSi_3$ compounds), which combines the hole-transporting efficiency of N,N-diphenyl-N,N-bis(3-methylphenyl)-1,1-biphenyl)-4,4-diamine) (TPD, a representative small-molecule HTL material) and the strong crosslinking/densification tendencies of organosilanyl groups, to condense with available substrate functionalities (e.g., hydroxy) and/or provide either a crosslinked blend HTL network comprising $TPDSi_2$ and a hole transporting polymer (e.g., poly(9,9-dioctylfluorene-co-N-(4-(s-butylphenyl)) diphenyl amine), TFB) or such a $TPDSi_2$ and TFB mixture or blend (i.e., $TPDSi_2$+TFB) in combination with a suitable substrate and a conventional PLED HTL (e.g., PEDOT-PSS). (See, FIG. 1.) Such HTL compositions or combinations of this invention can be used, alternatively, with one or more layers of $TPDSi_2$ or another silylated aromatic amine on a substrate (e.g., a PLED anode) to further enhance performance. Sorption or bonding of $TPDSi_2$ to a suitable anode (e.g., ITO) facilitates hole injection from the anode into the HTL and enhances device durability.

Without limitation, certain other compositions of this invention can comprise other silylated components such as diphenyl[4-(3-trichlorosilylpropyl)phenyl]amine, a triarylamine (i.e., TAA) and, in addition to the monosilylated compound (i.e., TAASi), the disilylated (i.e., $TAASi_2$) and trisilylated (i.e., $TAASi_3$) compounds. Regardless of the identity of such an aryl amine component, the polymeric hole transport component can be selected from any one of the available range of poly(fluorene) compounds, including but not limited to those represented by the acronyms PDHFDDOP, PDHFDHP and PDHF, such compounds as are known in the art and more fully described in co-pending application Ser. No. 10/507,75 1 and related international application no. PCT/US03/07963, filed Mar. 14, 2003, the entirety of which is incorporated herein by reference. The hole transport compositions of this invention are limited only by the availability of suitable silylated aryl amine components and polymeric hole transport components, the mixture or miscibility thereof one with another for device fabrication, and resulting polymer-incorporated siloxane-bonded matrix/network and corresponding hole transport function.

Representative compositions of this invention (e.g., $TPDSi_2$+TFB) are shown to have greater electron-blocking capacity compared to, for instance, PEDOT-PSS, which appears to be the reason for the 10-fold enhancement in current efficiency of the BT-based electron-dominated PLEDs. Further, a composition such but not limited to $TPDSi_2$+TFB can be deposited on PEDOT-PSS-coated ITO to form a multi-layered HTL. For instance, such a double-layer HTL can effectively planarize an ITO surface and minimize device leakage currents. Simultaneously, it has impressive hole-injection and electron-blocking capacities, all of which combine to afford excellent PLED performance with maximum current efficiencies as high as 17 cd/A, maximum luminance as high as 140,000 cd/m$^2$, and turn-on voltage as low as 2 V. Regardless, upon spin-coating onto an anode or another HTL component, the compositions of this invention can cure or cross-link under atmospheric conditions and/or upon heating to remove residual solvent. The resulting film is resistant to the deposition of another HTL or EML component. The present organosiloxane approach to fabricating PLED HTLs offers many other attractions such as ease of fabrication, flexibility in choosing HTL components, and reduced PEDOT-PSS-induced EML luminescence quenching, and can be applied as a useful strategy to achieve high-performance PLEDs.

DETAILED DESCRIPTION OF CERTAIN EMBODIMENTS

A TPDSi$_2$ SAM-modified anode of the sort which can be used in conjunction herewith, provides~two orders of magnitude greater hole injection from the anode into a PLED device compared to one having a bare anode. Such observations were made and discussed more fully in co-pending application Ser. No. 10/099,131 filed Mar. 15, 2002, the entirety of which is incorporated herein by reference. As discussed therein, modification of ITO anodes with a TPDSi$_2$ SAM is believed to change the ITO surface hydrophilicity, and minimizes the surface energy mismatch between hydrophilic ITO and a hydrophobic polymer. It has been widely recognized that interfacial energetics play an important role in the response characteristics of organic LEDs. The improved interfacial affinity between the modified ITO and the active polymer is likely a reason for the enhanced hole injection by TPDSi$_2$ SAMs. It is also possible that this surface functionalization effect is further enhanced by the favorable interface dipole/vacuum level shift detected in the UPS studies. Also, while there is only physical contact between a conventional light-emitting polymer and a bare ITO anode, for a SAM-modified PLED device, TPDSi$_2$ SAMs are chemically bonded to the ITO anode, which is likely to afford closer, more thermally robust contact of the TPDSi$_2$ SAM hole transporting units to the ITO anode and hence more efficient hole injection.

Figure 2:
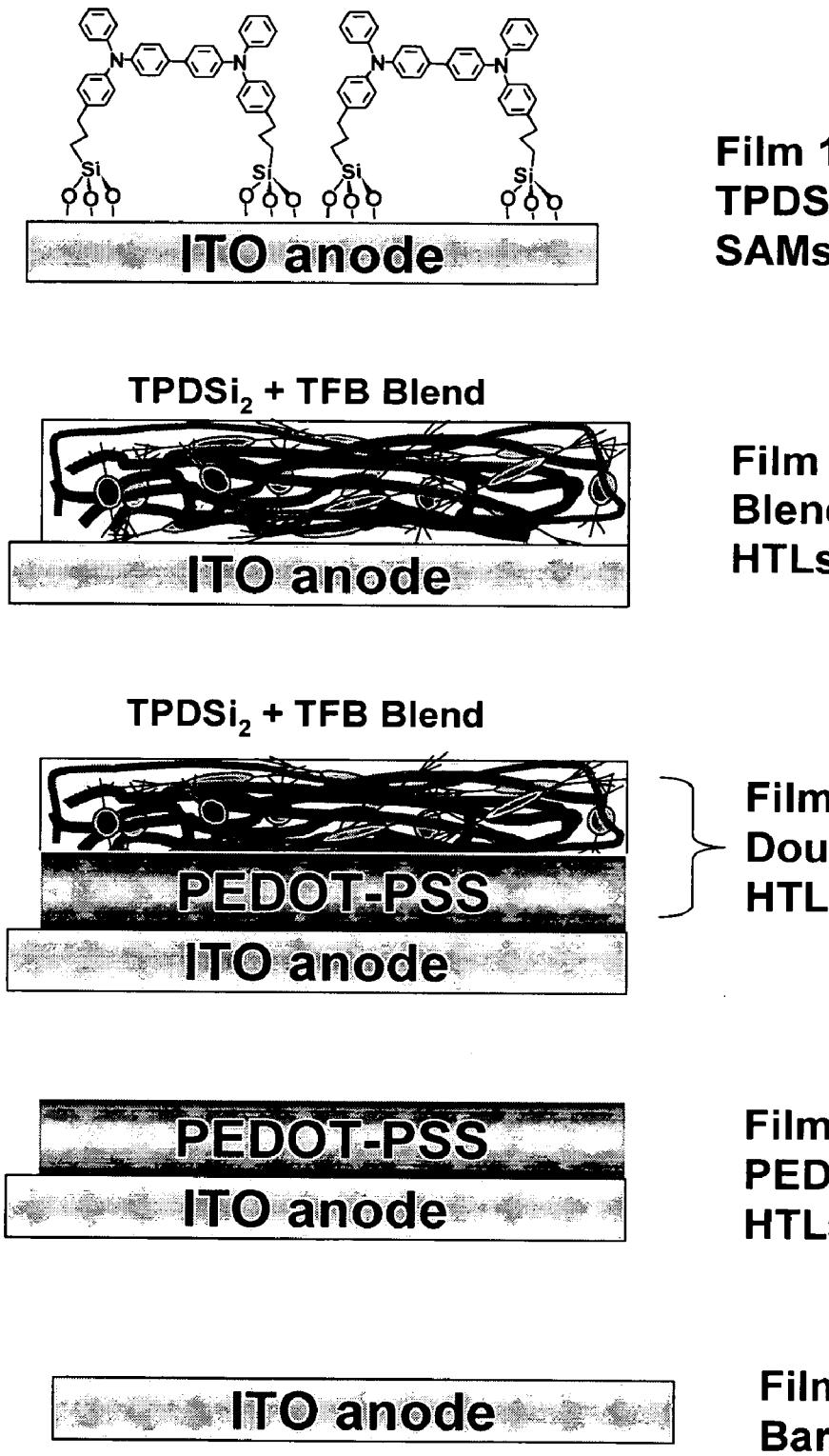
FIG. 2. Anode/HTL compositions used in fabrication of corresponding PLED device structures.

Regardless of such anode modification, the HTL compositions of this invention can effectively enhance hole injection. (Reference is made to FIG. 2, showing several anode/HTL film configurations. The corresponding device structure comprises, for instance, the particular emissive layer (TFB, etc.) discussed, below.) For example, a hole-only device such comprising ITO/TPDSi$_2$+TFB/TFB/Au/Al (see, FIG. 2, device 2) exhibits 200-fold greater hole injection fluence than a hole-only device of ITO/TFB/Au/Al (see, FIG. 2, device 5). At the TPDSi$_2$+TFB/TFB interface in device 2, hole transport can propagate through the same TFB structure, with near-perfect HOMO level alignment. Therefore, the difference in hole-injection characteristics between devices 2 and 5 reasonably originates from the very different nature of the ITO/TFB and ITO/TPDSi$_2$+TFB interfaces. For device 5, there is no covalent bonding between the ITO surface and the TFB layer. Thus, the surface energy mismatch between ITO and TFB and the 0.8 eV intrinsic hole injection barrier from ITO to TFB are likely causes for the poor hole-injection performance. For device 2, however, TPDSi$_2$ is covalently bonded to the ITO surface, which brings the TPDSi$_2$ hole-transporting units in very close contact (<1 nm) with the ITO surface. Furthermore, the TFB polymer chains of the HTL composition are believed immobilized within the crosslinked TPDSi$_2$ matrix to force some fraction of hole-transporting TFB chains into close contact with the ITO anode, and as a consequence, hole injection from ITO into the HTL is facilitated. Results show chemical bonding between the HTL and the ITO anode plays an essential role in achieving efficient anode hole injection.

Figure 6:
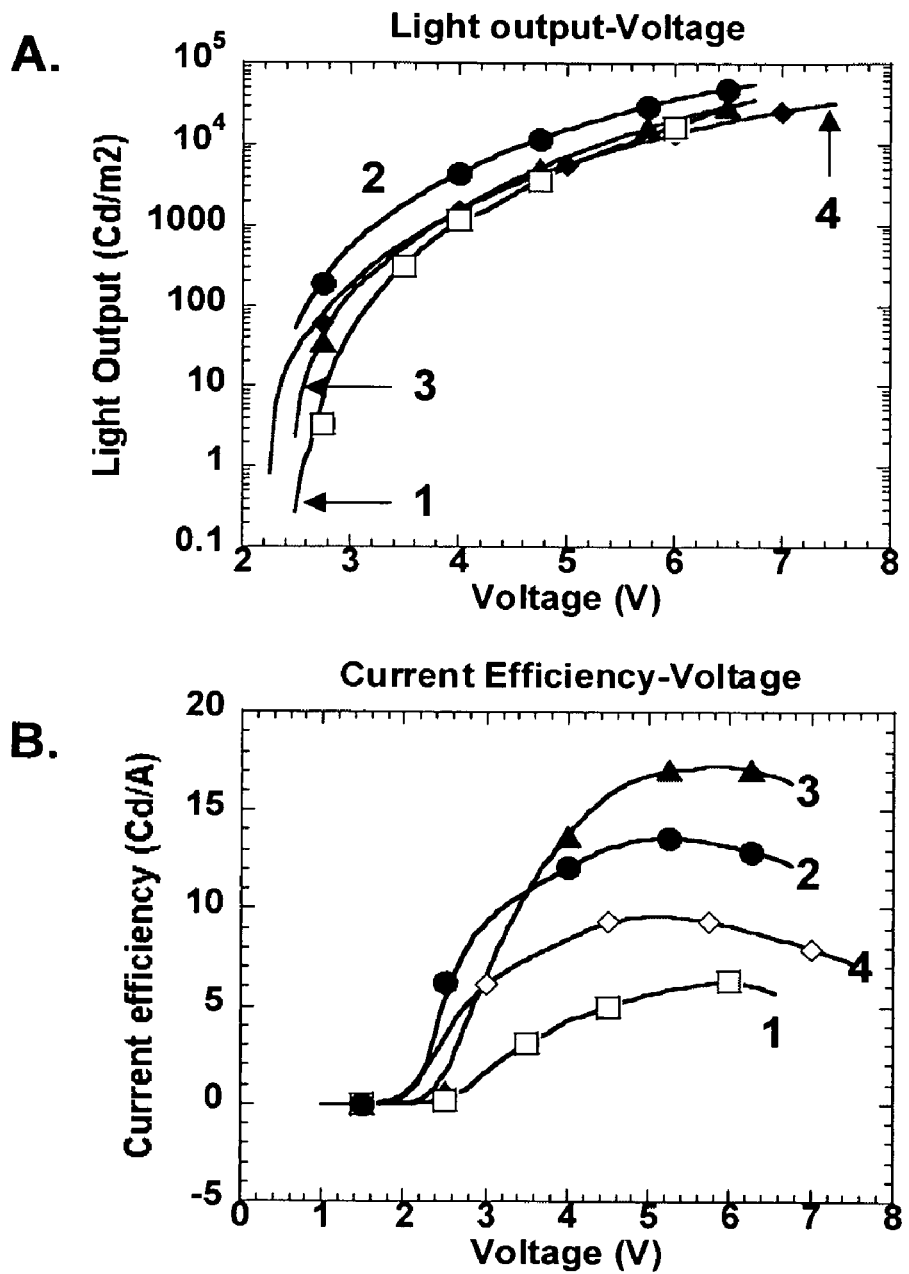
FIG. 6. A. Light output, B. Current efficiency-voltage characteristics as a function of operating voltage for PLED devices having the structure: ITO/HTL/TFB+BT blend/Ca/Al. The HTLs compared are: 1, squares: $TPDSi_2$ SAM; 2, filled circles: the blend HTL; 3, triangles, double layer HTL; 4, diamonds, PEDOT-PSS. (Lines through the data points are drawn as a guide.)

Both TPDSi$_2$ and TFB components contribute to the hole transporting capacity of the HTL composition. To demonstrate the hole transporting capacity of the TPDSi$_2$+TFB blend, devices were fabricated with the structure, ITO/HTL/TFB+BT (1:4) blend (70 nm)/Ca (10 nm)/Al (100 nm), with the HTL component either 1) TPDSi$_2$+TFB blend, 2) TPDSi$_2$+polystyrene (PS) blend, or 3) 1,6-bis(trichlorosilyl)hexane (C$_6$Si$_2$)+TFB blend. Polystyrene and C$_6$Si$_2$ are electric insulating materials; therefore, in HTL 2) or 3) the only one hole-transporting component is TPDSi$_2$ or TFB, and the contribution of TPDSi$_2$ or TFB to the hole transporting capacity of the TPDSi$_2$ +TFB blend can be separately evaluated. The L-V and CE-V responses of the device based on HTL 1) are shown in FIG. 6: maximum current efficiency~13.5 cd/A, turn-on voltage~2.0 V. Several performance characteristics of such PLED devices based on HTLs 1), 2), and 3) are compared in Table 1. PLED devices based on HTLs 2) and 3) exhibit maximum current efficiencies of ~8.5-9.0 cd/A and turn-on voltages ~2.5-3.0 V. This result suggests that both TPDSi$_2$ and TFB significantly contribute to the hole-transporting properties of the TPDSi$_2$+TFB blend.

TABLE 1

Comparison of maximum current efficiencies and turn-on voltages of PLED devices having the structure: ITO/HTL/TFB + BT blend/Ca/Al. The HTLs compared are: 1 TPDSi$_2$ + TFB blend; 2, C$_6$Si$_2$ + TFB blend; 3), TPDSi$_2$ + polystyrene blend.

|  | TPDSi$_2$ + TFB | C$_6$Si$_2$ + TFB | TPDSi$_2$ + PS |
|---|---|---|---|
| Maximum Current Efficiency (cd/A) | 13.5 | 9.0 | 8.5 |
| Turn-on Voltage (V) | 2.0 | 3.0 | 2.5 |

An effective HTL can function not only to maximize hole injection from the anode but also to block electron overflow from, and to confine excitons within, the EML. However, it is not clear whether PEDOT-PSS has sufficient electron-blocking capacity for a truly high-performance PLED HTL. For example, PEDOT-PSS has much greater conductivity than, and a distinctively different core structure from, conventional electron-blocking triarylamine small-molecule HTLs, and may have significantly different levels of electron-blocking properties. Recent work in the art showed the maximum current efficiency of a polyfluorene-based PLED was nearly doubled by inserting a poly(phenylenevinylene) (PPV) electron confinement layer between the PEDOT-PSS HTL and the EML. This result suggests that PEDOT-PSS HTLs do not possess as great electron-blocking capacity as PPV.

Figure 3:
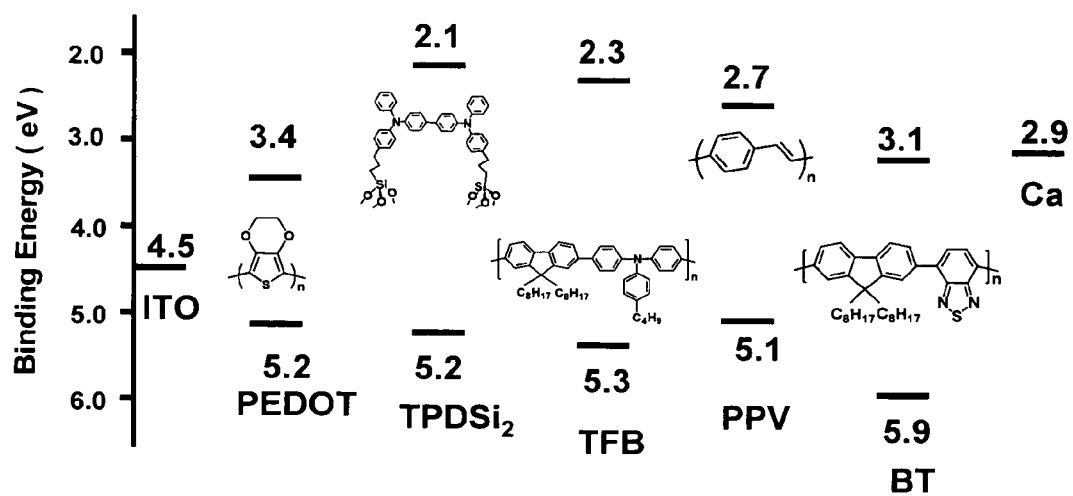
FIG. 3. Comparative HOMO-LUMO energy diagram of PLED components, showing favorable energy relationships available through use of this invention.
Figure 8:
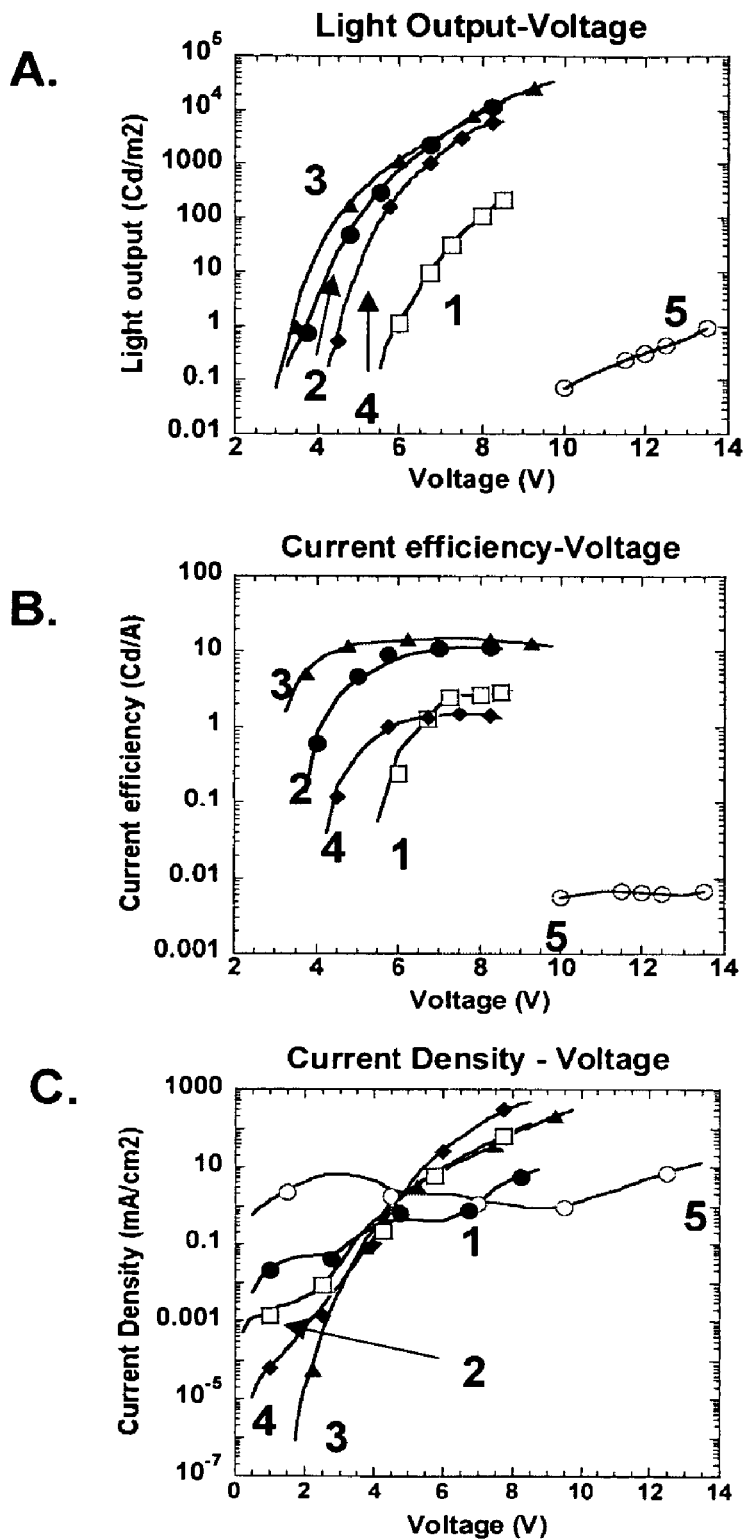
FIG. 8. A. Light output, B. Current efficiency, C. Current density-voltage characteristics as a function driving voltage for devices having the structure: ITO/HTL/BT/Ca/Al. The HTLs compared are: 1, squares : $TPDSi_2$ SAM; 2, filled circles: the blend HTL; 3, triangles, the double layer HTL; 4, diamonds, PEDOT-PSS; 5, open circles, bare ITO. (Lines through the data points are drawn as a guide.)

One composition/blend of this invention, TPDSi$_2$+TFB, has a similar triarylamine core structure to those of classic HTL/electron-blockers such as NPB and TPD, and is likely to have comparable electron-blocking properties. For these reasons, it was of interest to determine whether the TPDSi$_2$+TFB blend has greater electron-blocking capacity than does PEDOT-PSS and also to determine how the difference in electron-blocking capacity can affect PLED device response. To evaluate the electron-blocking properties of PEDOT-PSS and the TPDSi$_2$+TFB blend, electron-dominated PLEDs were fabricated with BT as the EML and Ca as the cathode (FIG. 8). BT has excellent electron transport but weak hole transport capacity (FIG. 3), and in a BT/Ca-based device there should be a significant electron flux reaching the HTL/BT interface, which renders it an ideal model structure to investigate electron-blocking characteristics at the HTL/BT interface.

The only obvious difference between device 3 (ITO/PEDOT-PSS/TPDSi$_2$+TFB blend/BT/Ca/Al) and device 4 (ITO/PEDOT-PSS/BT/Ca/Al) is the presence of a thin TPDSi$_2$+TFB blend layer between the PEDOT-PSS and BT layers. As seen in FIG. 8, the 10-fold enhancement in current efficiency and lesser total current flow for device 3 reflects the pronounced electron-blocking characteristics of the TPDSi$_2$+TFB blend at the TPDSi$_2$+TFB/BT interface. Therefore, in device 4, a significant electron flux must simply pass through BT layer without encountering/recombining with holes and are is then simply drained unproductively to the ITO anode through the highly conductive PEDOT-PSS HTL, leading to lower hole-electron recombination efficiency hence, lower device current efficiency. Clearly, the TPDSi$_2$+TFB blend exhibits significantly greater electron-blocking properties than a conventional PEDOT-PSS HTL, and PLED performance can be dramatically enhanced by depositing a thin TPDSi$_2$+TFB blend electron-blocking interlayer onto the PEDOT-PSS HTL.

A PLED HTL can also function to planarize an anode surface, to prevent local shorting currents, and to thus improve device performance and uniformity of performance. The commercial ITO source used herein has an RMS roughness of 3.0-4.0 nm by contact mode AFM, and spikes as high as 20 nm can be occasionally observed on the surface by AFM. For the series of electron-dominated PLED devices using BT as the EML (FIG. 8), there should be a significant electron flux reaching the HTL/BT interface, which can serve to magnify the anode/HTL-mediated leakage currents. Therefore, the present BT-based PLED series represents a good model system in which to investigate leakage current levels and planarization effects associated with the various HTLs. As seen in FIG. 8, when bare ITO is used as the anode, the BT-based device 5 (ITO/BT/Ca/Al) supports a substantial leakage current density of ~1 mA/cm$^2$. The ability of the TPDSi$_2$ SAM hydrophobic structure to exclude moisture likely plays a role in reducing leakage currents in the BT-based devices on 1 (ITO/TPDSi$_2$ SAM/BT/Ca/Al). However, while a TPDSi$_2$ SAM only provides conformal monolayer coverage on the ITO surface, it has no discernable planarization effects (RMS roughness=3.9 nm). Therefore, there is reduced but still significant leakage current density (0.01-0.1 mA/cm$^2$) in the TPDSi$_2$ SAM/BT-base A spin-coated TPDSi$_2$+TFB blend can also planarize the ITO surface (RMS roughness reduced to 1.7 nm), which leads to greater reduction in device leakage current density (to 0.001-0.01 mA/cm$^2$). While a TPDSi$_2$+TFB blend coating (thickness ~10-15 nm) may be insufficient to fully cover ITO surface spikes, double-layer HTL (PEDOT-PSS/TPDSi$_2$+TFB blend) has thickness of ~60 nm and can planarize ITO surface more effectively (RMS roughness now ~1 nm), which is consistent with the observed negligible leakage current densities (current at 2V~0.00001 mA/cm$^2$—comparable to the uncertainly limits of the instrumentation) in device 3 of FIG. 8.

The response characteristics of the double-layer HTL-based devices vs. those based on a TPDSi$_2$ SAM alone, an HTL blend, and PEDOT-PSS can be analyzed from three perspectives: 1) hole injection capacity (studied using hole-only devices); 2) electron-blocking capacity (studied by BT-based electron-dominated PLED devices); 3) anode planarization effects and leakage current densities.

Figure 7:
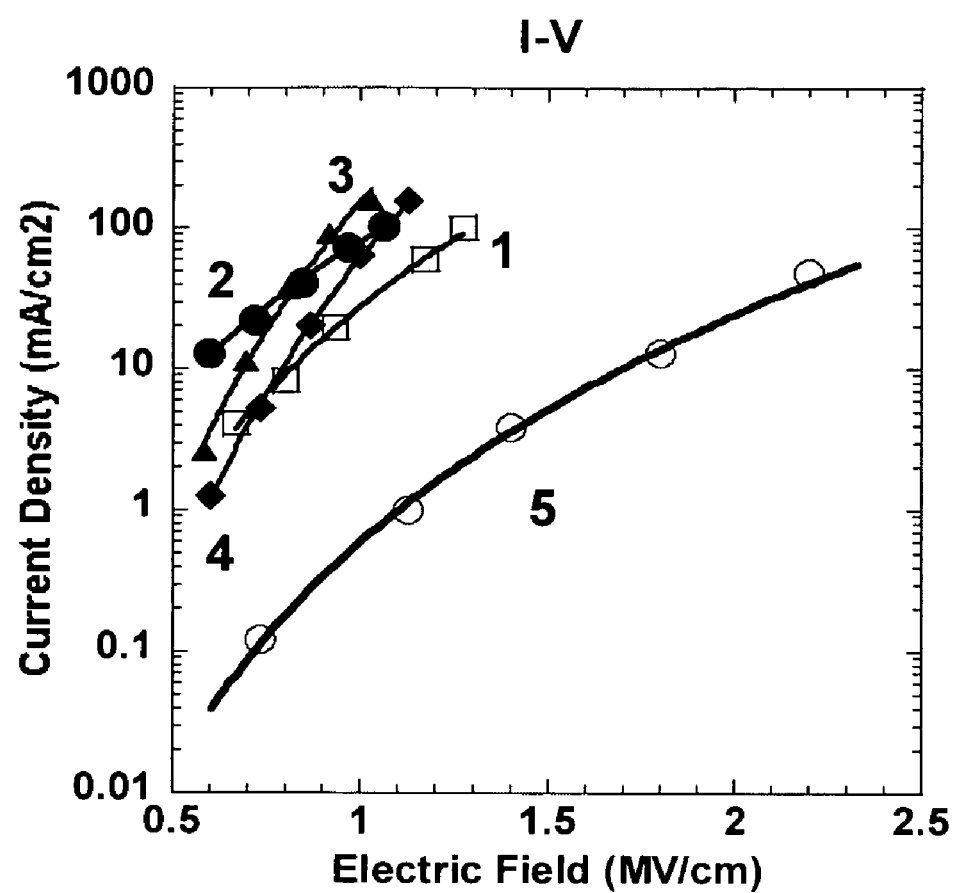
FIG. 7. current density vs. electric field response for hole only devices having the structure: ITO/HTL/TFB/Au/Al. The HTLs compared are: 1, squares: $TPDSi_2$ SAM; 2, filled circles: the blend HTL; 3, triangles, the double layer HTL; 4, diamonds, PEDOT-PSS, 5, open circles, bare ITO. (Lines through the data points are drawn as a guide.)

As shown in FIG. 7, the double-layer HTL provides slightly greater hole injection capacity compared to the TPDSi$_2$ SAM, but alone cannot explain the difference in device efficiency of the corresponding PLED devices in FIG. 6B (current efficiency, 17 cd/A vs. 6 cd/A). The TPDSi$_2$ structure should be electron-blocking, however, there is a question as to whether or not the ultra-thin TPDSi$_2$ SAM is sufficiently thick to effectively block the overflow of electrons. As can be seen in FIG. 8B, the maximum current efficiency of the TPDSi$_2$ SAM-based BT device is only ~20% of that of the double-layer HTL-based device, perhaps indicating that the electron-blocking capacity of the TPDSi$_2$ SAM is significantly weaker than that of a double-layer HTL. In addition, as can be seen in FIG. 8A, the turn-on voltage of the TPDSi$_2$ SAM and the double-layer HTL-based devices are 5.5 V and 3.1 V, respectively. It is widely recognized in the art that electron density build-up at the HTL/EML interface can enhance anode hole injection at lower fields, and as a result, devices with a greater electron-blocking capacity at the HTL/EML interface should exhibit lower turn-on voltages. Therefore, the significantly greater turn-on voltage of the TPDSi$_2$ SAM-based device further supports the contention that the TPDSi$_2$ SAM has weaker electron-blocking capacity than a double-layer HTL.

Finally, as shown is FIG. 8C, the TPDSi$_2$ SAM-based device exhibits 1000-fold greater leakage current than a double-layer HTL-based device at 2V, which is probably due to the lack of TPDSi$_2$ SAM planarizing effects on the ITO surface. As discussed in the literature charge tunneling and image forces can be present at length scales of ~1 nm, which is comparable to the width of the electron-blocking triarylamine core structure of the TPDSi$_2$ SAM, leading to possible electron tunneling through the ultra-thin TPDSi$_2$ SAM. To conclude, although the TPDSi$_2$ SAM structure is electron-blocking, it appears to be too thin to provide optimum electron-blocking or to prevent local leakage currents, which is also the reason why the double-layer HTL-based PLED exhibits superior performance.

As shown in FIG. 7, the hole-injection capacities of a double-layer HTL and the corresponding blend HTL are comparable. Note from FIG. 8, however, that a double-layer HTL-based device still exhibits 50% greater current efficiency and 0.4 V lower turn-on voltage vs. a blend HTL-based device, which suggests a slightly weaker electron-blocking capacity for the blended HTL compositions. Without limitation, it is suspected that the blend HTL (thickness ~10-15 nm) is not sufficiently thick to fully cover the ITO surface, especially occasional spikes, which could introduce significant leakage current density and may adversely affect the electron-blocking properties. AFM analysis of the ITO/TPDSi$_2$+TFB films appear to support this position: ITO-originated surface spikes are significantly reduced with the TPDSi$_2$+TFB coating, but can still be occasionally observed.

As discussed above, for the BT-based electron-dominated device series, a double-layer HTL device exhibits ~10-fold greater current efficiency than does the PEDOT-PSS device due, at least in part, to the enhanced electron-blocking properties of the former. In addition, other factors may also play important roles. As noted above, PEDOT-PSS has been shown to mediate polyfluorene EML oxidative doping, leading to reduced luminous efficiency. For the present double-layer HTL compositions, since the TFB component, is commonly used as the hole-transporting component in EML blends and the TPDSi$_2$ component provides stable, neutrally-charged siloxane and arylamine moieties, both components should not introduce luminescence quenching as does PEDOT-PSS. Therefore, the present double-layer HTL may reduce PEDOT-PSS-induced luminescence quenching by separating the PEDOT-PSS layer from the EML.

As shown in FIG. 6, for the TFB+BT-based device series in which the EML has balanced charge transport, the double-layer HTL still provides significantly greater device performance than PEDOT-PSS (current efficiency =17 cd/A vs. 10 cd/A). The reason for this appears to be that, although TFB+BT has balanced electron and hole transport, there is still a non-negligible electron flow reaching the PEDOT-PSS HTL/EML interface without recombining with holes in device 4, thus resulting in lower recombination efficiency and hence lower luminous efficiency. The reduced PEDOT-PSS-induced luminescence quenching by the double-layer HTL may also play a role here.

The preceding characterizations and comparisons are summarized in Table 2, below. The 17 cd/A current efficiency of the double-layer HTL-based devices is one of the highest PLED current efficiencies reported to date. With further materials and device structure refinement, additional improvements can be expected. In addition, the present double-layer HTL approach offers many other attractions: 1) convenience: crosslinking of the TPDSi$_2$+TFB component blend is complete within seconds after spin-coating in air at room temperature, with no special high-temperature baking, photo, or thermal crosslinking required; 2) flexibility: siloxane materials other than TPDSi$_2$ and polymers other than TFB should also be applicable; future siloxanes or polymers having greater hole-transporting and/or electron-blocking capacity should yield even more effective hole-transporting and electron-blocking layers and greater PLED performance; 3) energetic tuning: PLED energy level matching should be readily tunable by using a hole-transporting polymer that matches an EML HOMO level. Without limitation, TFB was used as a hole-transporting component of both the HTL and EML device components. Thus, hole transport from the HTL to the EML can propagate through the same TFB structure, with near-perfect HTL-EML HOMO level alignment. Therefore, such an approach with various compositions of this invention can be used as a general strategy to manipulate PLED HTL-EML HOMO level alignment.

TABLE 2

Comparison of TPDSi$_2$ SAM, the blend HTL, the double-layer HTL, and PEDOT-PSS features for PLED fabrication.

| | PEDOT-PSS | 1, TPDSi$_2$ SAM | 2, The blend HTL | 3, The double layer HTL |
|---|---|---|---|---|
| Thickness (nm) | 45 | 1.8 | 15 | 60 |
| RMS Roughness (nm) | 1.1 | 3.9 | 1.7 | 1.0 |
| ITO Planarization | Better | No | Good | Best |
| Hole Injection | Good | Good | Good | Good |
| Electron-Blocking | No | No | Good | Best |
| Maximum Current Efficiency (Cd/A) | 10 | 6.0 | 14 | 17 |
| Turn-on Voltage (V) | 2.0 | 2.5 | 2.0 | 2.0 |
| Notes | Poor electron-blocking | Interfacial modification; hole injection | Crosslinked network; flexibility; HTL/EML HOMO alignment | Electron-blocking; new rationale for PLED design |

As shown recently in the art, upon inserting a poly(p-phenylenevinylene) (PPV) electron confinement layer between a PEDOT-PSS HTL and a fluorene-based EML, the current density in the PLED device was reduced by ~20% and the maximum current efficiency was nearly doubled. In that study, the EML was a blend of poly(9,9-dioctylfluorene) (PFO) and BT; that is, a balanced-charge-transporting EML. The reduced current density observed may be partially due to the 10-fold lower hole mobility of PPV compared that of PFO. However, the current reduction alone is not enough to explain the doubling of current efficiency. It is suggested that a significant contribution to the efficiency increase comes from the electron-blocking effect at the PPV/EML interface, and that PEDOT-PSS HTLs might not possess as great electron-blocking capacity as PPV.

To examine this issue, rather than EMLs with balanced charge transport as in an electron-dominated EML, BT was chosen to fabricate an electron-dominated PLED structure, PEDOT-PSS/BT/Ca, in which there are sizable electron currents reaching the PEDOT-PSS/BT interface, and electron-blocking effects at interface can be readily studied. Using this model structure, the insertion of a TPDSi$_2$+TFB electron blocking layer (EBL) between the PEDOT-PSS HTL and the BT EML leads to ~15-fold increase in PLED device current efficiency and 2-fold decrease in current density, clearly a result of effective electron-blocking at the HTL/EML interface. The result also shows that PEDOT-PSS HTLs possess significantly weaker electron-blocking capacity than the present TPDSi$_2$+TFB compositions.

The present compositions (e.g., a TPDSi$_2$+TFB blend) offer other significant attractions vs. PPV as an EBL, including but not limited to: 1) TPDSi$_2$+TFB blends should have a hole mobility comparable to PFO or TFB, and do not suppress PLED anode hole injection, as supported by the hole-only device data (FIG. 7). In contrast, PPV has lower hole mobility than most polyfluorene EMLs, which may reduce hole injection in the device and increase the device operating voltage. 2) TPDSi$_2$+TFB blends at most only exhibit weak luminescence in blue region and should be less likely to interfere with EML light emission than should PPV, a well-known efficient yellow-green-emitting polymer. 3) Fabrication of TPDSi$_2$+TFB blends is convenient. As noted above, TPDSi$_2$+TFB blend crosslinking is complete within seconds after spin-coating in air at room temperature, with no special high-temperature curing, photo, or thermal crosslinking required. However, fabrication of an insoluble PPV layer involves the spin-coating of a PPV precursor followed by high-temperature (200-300° C.) in situ polymerization. The resulting PPV layer is not covalently linked to the anode surface in any obvious way. 4) PPV has LUMO energy of ~2.7 eV; however, the LUMO energy of the TPDSi$_2$+TFB blend is ~2.3 eV (FIG. 3), which is at least 0.5 eV smaller than typical EML LUMO values (2.8-3.1 eV) and should therefore give rise to greater electron-blocking capacity vs. PPV.

Consequences of the present siloxane HTL approach are at least two-fold. First, the results show for the first time that high-performance PLEDs can be achieved using an electron-dominated EML. For a conventional PLED device, in which p-doped conducting polymers (e.g. PEDOT-PSS) are usually employed as the HTL, it has been necessary for the EML to have balanced hole and electron transports to achieve superior PLED performance, and the choice of a high-performance PLED EML has to date been quite limited. Many unipolar emissive polymers (electron-dominated or hole-dominated), despite their impressive luminescence properties, yield poor PLED device performance and have been regarded as unsuitable for PLED EML applications. An example of such an electron-dominated EML material is BT, which has excellent electroluminescent properties but highly electron dominant transport capacity. As a result, PLEDs using BT as the EML and PEDOT-PSS as the HTL usually exhibit poor device performance (current efficiency 1-2 cd/A$^{53}$). Here, however, it is shown that BT-based PLEDs can exhibit excellent performance when the conventional PEDOT-PSS HTL is replaced with a crosslinked siloxane-based HTL composition of this invention that has greater electron-blocking capacity. This result indicates that the marginal performance of PEDOT-PSS/BT/Ca-based devices is caused by the insufficient electron-blocking capacity of the PEDOT-PSS HTL instead of the unipolar charge transport properties of BT. By employing an electron-blocking HTL in a PLED structure, the choice of PLED EML is no longer limited to balanced-charge-transporting emissive polymers, and consequently, there should be far greater flexibility for further development and optimization of PLED EMLs.

In addition, the performance of PLEDs based on an electron-dominated EML (BT) and an electron-blocking HTL (e.g., various TPDSi$_2$+TFB-based double-layer HTL compositions) of this invention (e.g., current efficiency=17 cd/A) significantly surpasses that of conventional PLEDs based on a charge-balanced EML (TFB+BT blend) and a conductive polymer HTL (PEDOT-PSS; current efficiency=10 cd/A). This result can be rationalized, in that in a PEDOT-PSS/TFB+BT-based device, although TFB+BT has balanced electron and hole transport, there is likely to be a non-negligible electron flux that reaches the HTL/EML interface and is drained with recombination to the anode, leading to lower luminous efficiency. Furthermore, the peak recombination zone of such devices should be located near the middle part of the TFB+BT EML, and the distance between the peak recombination zone and the cathode or the PEDOT-PSS HTL should ~35 nm, which may lead to considerable cathode or PEDOT-PSS-induced luminescence quenching. For a TPDSi$_2$+TFB/BT-based device, however, the peak recombination zone should be located near the TPDSi$_2$+TFB/BT interface which is ~70 nm away from the cathode, leading to less cathode-induced luminescence quenching. Also, a TPDSi$_2$+TFB layer should not quench luminescence as does the PEDOT-PSS HTL since its triarylamine core structure is widely used in PLED EML components. Therefore, among the two approaches to design PLEDs (PLEDs having an electron-dominated EML and an electron-blocking HTL, or PLEDs having a charge balanced EML and a conventional HTL), the former appears to be able to afford significantly greater PLED performance. More fundamentally, this invention shows that utilizing the new HTL compositions and optimizing HTL electron-blocking properties may be a more productive approach to achieving high-performance PLEDs than merely manipulating the charge transport properties of the EML.

EXAMPLES OF THE INVENTION

The following non-limiting examples and data illustrate various aspects and features relating to the compositions, devices and/or methods of the present invention, including the assembly of light-emitting diode devices comprising various hole transport compositions and/or layers, as are available through the techniques and methodologies described herein. In comparison with the prior art, the present compositions, layers and/or devices provide results and data which are surprising, unexpected and contrary thereto. While the utility of this invention is illustrated through the use of several compositions and related device structures, it will be understood by those skilled in the art that comparable results are obtainable with various other hole transport compositions, layers, luminescent media and/or devices, as are commensurate with the scope of this invention.

Materials. Starting materials such as fluorene, n-butyl lithium, and n-octyl bromide were purchased from Aldrich. Anhydrous toluene was purchased from Aldrich and passed through a Grubbs column system to further remove O$_2$ and H$_2$O (The Grubbs column system consists of two 18 L stainless steel columns. The first column is packed with activated alumina, which removes polar impurities such as H$_2$O; the second one is packed with the copper catalyst, Q5, which removes trace O$_2$). Ethyl ether was dried over and distilled from Na/benzophenone. PEDOT-PSS in aqueous solution (Baytron P) was purchased from H. C. Starck, a Bayer company, and used without additional modification (Baytron P grade VP AI 4083 was used, which has a stated PEDOT/PSS ratio of 1:6 and a cast film resistivity of 1000 Ω·cm). All other reagents were used as received unless otherwise indicated. Indium tin oxide (ITO)-coated glass sheets (20 Ω/□, RMS roughness=30–40 Å) were purchased from Colorado Concept Coating. Single-crystal Si (111) substrates for specular X-ray reflectivity measurements were purchased from Silicon Sense Inc.

General Physical Measurements. NMR analysis was performed using a Varian VXR-400 MHz NMR spectrometer using CDCl$_3$ as the solvent. Chemical shifts are referenced to the residual protonated solvent resonance. Elemental analysis was carried out at Midwest Microanalysis Lab (Indianapolis, Ill.). The structures of all organic materials are verified by NMR and elemental analysis. Thermogravimetric analysis (TGA) was carried out on an SDT 2960 simultaneous DTA-TGA instrument (TA Instruments) with a scan rate of 10° C./min under N$_2$. Molecular weights of the polymers synthesized were measured versus polystyrene standards using a Waters room temperature gel permeation chromatography (GPC) system equipped with a Waters 2410 refractive index detector and a Waters 515 HPLC pump. Optical absorption spectroscopy of organic films were carried out with a Varian Cary 1E UV-Visible instrument.

The morphologies of all thin films were evaluated by atomic force microscopy (AFM) using a Nanoscope III microscope with A and D scanners (Digital Instruments, Inc.). All images were recorded under ambient conditions in the contact mode with Si$_3$N$_4$ cantilevers having pyramidal tips with 70° cone angles and 20-50 nm radii of curvature. No attempt was made to account for tip convolution. The cantilever had a force constant of 0.12 N/m. The images were obtained using the height mode with a total force of 20-60 nN and a scan rate of 10 Hz. The same image was scanned at least three times to ensure the reproducibility as well as by scanning different area sizes (i.e., higher or lower magnifications) to verify image consistency. All the RMS surface roughness values are reported over an area of ~25 μm². Thicknesses of all organic thin films were measured using a Tencor P-10 surface profiler.

X-ray Photoelectron Spectroscopy (XPS) analyses were performed at Northwestern University with an Omicron ESCA probe, which was equipped with EA125 energy analyzer. Photoemission was stimulated by a monochromated Al Kα radiation (1486.6 eV) with the operating power of 300 W. A low-energy electron flood gun was employed for charge neutralization. Survey scan and high-resolution scan were collected using pass energies of 50 and 25 eV, respectively. Binding energies of spectra were referenced to the C 1 s binding energy set at 284.8 eV.

The ionization potential (IP) and work function of $TPDSi_2$ SAM-modified ITO were determined by ultraviolet photoelectron spectroscopy (UPS) at the University of Arizona using the 21.2 eV He (I) source (Omicron H15-13) of a Kratos Axis-165 Ultra photoelectron spectrometer. Work functions of the clean substrates were obtained by recording the difference in energy between the high kinetic energy onset and the low kinetic energy cutoff for photoionization. Samples were biased at ±5 V to enhance the slope of the low kinetic energy cutoff region. Estimates of the high kinetic energy onset for photoionization were obtained by extrapolation of the high kinetic energy portion of the photoemission spectrum to the zero count baseline. For ITO samples with self-assembled films of the molecular modifiers, HOMO and IP for the triarylamine cores of these modifiers were obtained from the UPS data, correcting for shifts in vacuum level relative to the clean ITO substrate. HOMO values were estimated from the median energy of the clearly defined photoionization peak, while IP values were estimated from the extrapolation of the high kinetic energy edge of that peak to zero intensity. Both values reported were corrected for apparent shifts in vacuum level.

Example 1

Synthesis of Poly(9,9-dioctylfluorene-co-N-(4-(s-butylphenyly)diphenyl amine) (TFB). TFB was synthesized from 2,7-bis(4,4,5,5,-tetramethyl-1,3,2-dioxaborolan-2-yl)-9,9-dioctylfluorene and 4-s-butylphenyl)-N,N-bis(4-bromophenyl)aniline using conventional Suzuki coupling methodology and procedures similar to those described in the literature. The reagents 2,7-bis(4,4,5,5-tetramethyl-1,3,2-dioxaborolan-2-yl)-9,9-dioctylfluorene and 4-s-butylphenyl)-N,N-bis(4-bromophenyl)aniline were synthesized using procedures also described in literature. Experimental details are as follows.

To a mixture of purified 4-(3-methylpropyl)-N,N-bis(4-bromophenyl)aniline (0.459 g, 1.0 mmol) and 2,7-bis(4,4,5,5-tetramethyl-1,3,2-dioxaborolan-2-yl)-9,9-dioctylfluorene (0.642 g, 1.0 mmol) in 10 mL oxygen-free toluene under nitrogen was added 0.1 g (0.25 mmol) of the phase transfer catalyst "Aliquat 336" and 6 mL of 2 M aqueous $Na_2CO_3$ solution (the $Na_2CO_3$ solution was purged with $N_2$ for 10 min before being added to the reaction); the mixture was then stirred under nitrogen for 20 min, followed by the addition of 3 mg (4 μmol) of tetrakis(triphenylphosphine)palladium(0) as the catalyst. The reaction was vigorously stirred at ~120° C. for 4-6 h to yield a highly viscous mixture; to reduce viscosity and maintain vigorous stirring, 5-10 mL toluene was then added. The reaction mixture was maintained under the same conditions for 10 h, after which 0.10 mL (0.80 mmol) of phenylethylene boronate was added. After another 10 h of reaction time, 0.30 mL (2.2 mmol) bromobenzene was added as an end capping agent. The reaction mixture was poured into 400 mL methanol after an additional 5 h and the precipitated polymeric product collected to afford 0.70 g of pale yellow polymer. The polymer was then carefully purified by repetitive dissolution in toluene and precipitation with methanol to remove ionic impurities and catalyst residues. The number and weight average molecular weights (Mn and Mw) of the TFB obtained by this procedure were determined to be 31,000 and 88,000 (polydispersity=2.88), respectively, by GPC using THF as the eluent and polystyrene standards. $^1$H NMR (400 MHz, $CDCl_3$): δ(ppm) 7.76 (d, J=6.8 Hz, 2H), 7.62 (s, 2H), 7.59 (d, J=9.2 Hz, 2H), 7.26 (d, J=6.0 Hz, 4H), 7.02-6.99 (m, 8H), 2.64-2.60 (m, 1H), 2.05 (m, 4H), 1.66-1.60 (m, 2H), 1.28 (t, J=6.4 Hz, 3H), 1.20-1.00 (m, 20H), 0.89 (t, J=6.0 Hz, 3H), 0.81 (t, J=5.2 Hz, 6H), 0.74 (m, 4H). Anal. Calcd. for $C_{51}H_{61}$,N: C, 89.08 H, 8.88, N, 2.04. Found: C, 89.38; H, 8.44; N, 2.18.

Example 2

Synthesis of Poly(9,9-dioctylfluorene-co-benzothiadiazole) (BT). BT was synthesized from 2,7-bis(4,4,5,5-tetramethyl-1,3,2-dioxaborolan-2-yl)-9,9-dioctylfluorene and 4,7-dibromo-2,1,3-benzothiadiazole using conventional Suzuki coupling methodology and procedures similar to those described in the literature. The reagent 4,7-dibromo-2,1,3-benzothiadiazole was synthesized using a procedure also described in the literature. Experimental details are described as follows.

Under inert atmosphere, a 50 mL reaction flask was charged with 0.15 g (0.51 mmol) of purified 4,7-dibromo-2,1,3-benzothiadiazole and 3 mL oxygen-free THF. Next, the 4,7-dibromo-2,1,3-benzothiadiazole mixture was brought to ~60° C. with stirring, at which point the benzothiadiazole dissolved. Bis(tetraethylammonium) carbonate (1.0 g 3.0 mol) in 2 mL de-ionized water was purged with $N_2$ gas for 10 min and then added to the reaction flask, and the mixture was stirred under $N_2$ for 10 min. Next, 2,7-bis(4,4,5,5-tetramethyl-1,3,2-dioxaborolan-2-yl)-9,9-dioctyfluorene (0.34 g, 0.52 mmol) was dissolved in 3 mL toluene, purged with $N_2$ gas for 10 min, and added to the reaction flask. The reaction mixture was stirred under $N_2$ for 20 min before addition of 3 mg (4 μmol) of the catalyst $(Ph_3P)_4Pd$. The reaction mixture was vigorously stirred and refluxed at 90° C. for 18 h, during which time the reaction mixture became highly viscous. Bromobenzene (0.10 mL, 0.70 mmol) was then added and after 10 h, phenylethylene boronate (0.30 mL, 2.4 mmol) was added as an end-capping reagent. The reaction mixture was poured into 300 mL methanol after 5 h and the precipitated polymer was collected to afford 0.3 g of yellow fibrous product. The polymer was then carefully purified by repetitive dissolution in toluene and precipitation with methanol to remove ionic impurities and catalyst residues. The number and weight average molecular weights ($M_n$ and $M_w$) of the BT produced in this procedure were determined to be 143,000 and 269,000 (polydispersity=1.88), respectively, by GPC using THF as the eluent and polystyrene standards. $^1$H NMR (400 MHz, $CDCl_3$): δ(ppm), 8.10-7.97 (m, 8H), 2.18-2.10 (m, 4H), 1.25-0.96 (m, 24H), 0.81 (t, J=6.4 Hz, 6H). Anal. Calcd. for $C_{35}H_{42}N_2S$: C, 80.46; H, 8.05; N, 5.36; S, 6.13. Found: C, 80.22; H, 8.16; N, 5.32; S, 6.30.

Example 3

Fabrication procedure for $TPDSi_2$ self-assembled monolayers (SAMs). Clean ITO substrates were first treated with an $O_2$ plasma for 3 min and then transferred to a dry, clean Schlenk flask. Following strict Schlenk protocol, the Schlenk flask was further dried using a flame or a heatgun, followed by addition of a 1.0 mM dry toluene solution of $TPDSi_2$ into the Schlenk flask by syringe. The ITO substrates were immersed in the $TPDSi_2$ solution at ~95° C. for 40 min, followed by rinsing and sonication with anhydrous toluene 3 times. The substrates were next immersed in a water/acetone mixture (1:100) with sonication for 5 min and then transferred to a 120° C. oven for 30 min. Silyl-derivatized TPD and TAA are prepared as described in the aforementioned applications, as well as in the literature. See, J. Cui, Q. Huang, J. G. C. Veinot, H. Yan, and T. J. Marks, Adv. Mater. 14, 565 (2002); and J. Cui, Q. Huang, Q. Wang, and T. J. Marks, Langmuir 17, 2051-2054. (2001).

Example 4

Specular X-ray reflectivity measurements. Specular x-ray reflectivity experiments on coated single-crystal Si (111) substrates were performed at the Naval Research Laboratory X23B beamline at the National Synchrotron Light Source. Details of this measurement procedure and subsequent data analysis are described elsewhere. (Cui, J.; Huang, Q.; Wang, Q.; Marks, T. J. *Langmuir* 2001, 17, 2051-2054. Cui, J.; Huang, Q.; Veinot, J. C. G.; Yan, H.; Wang, Q.; Hutchinson, G. R.; Richter, A. G.; Evmenenko, G.; Dutta, P.; Marks, T. J. *Langmuir* 2002, 18, 9958-9970. Roscoe, S. B.; Kakkar, A. K.; Marks, T. J.; Malik, A.; Durbin, M. K.; Lin, W. P.; Wong, G. K.; Dutta, P. *Langmuir* 1996, 12, 4218-4223. Malik, A.; Lin, W.; Durbin, M. K.; Marks, T. J.; Dutta, P. *J Chem. Phys.* 1997, 107, 645-652.)

Example 5

Deposition of conventional PEDOT-PSS HTLs. For the deposition of PEDOT-PSS, by way of comparison with the present invention, ITO substrates were first washed using standard organic solvent/sonication procedures described above and then cleaned with an oxygen plasma treatment, immediately followed by spin-coating of the commercial PEDOT-PSS solution onto the ITO at ~3000 rpm. The resulting films were then cured on a hotplate in air at ~150-200° C. for 10 min, and stored in an inert atmosphere glove box prior to TPDSi$_2$+TFB blend or EML deposition.

Example 6a

Deposition of spin-coated TPDSi$_2$+TFB blend films. For the deposition of TPDSi$_2$+TFB blend coatings, ITO substrates were cleaned using the standard organic solvent/sonication procedure, however, the usual oxygen plasma treatment was found to be unnecessary. TPDSi$_2$ and TFB solutions (concentration of each ~2.5 mg/mL) in anhydrous toluene were first prepared in an inert atmosphere glove box (O$_2$ and moisture levels<1 ppm) and then blended (mass ratio of TPDSi$_2$:TFB=1:1). This blend solution was transferred from the glove box using a sealed syringe and then spin-coated onto the clean ITO substrates at ~3000 rpm (film thickness of TPDSi$_2$+TFB~15 nm). The resulting film was dried at ~90° C. in a vacuum oven (15 Torr) for 0.5 h and, optionally, stored in the glove box before emissive layer (EML) spin-coating.

Example 6b

TPD-Si$_2$/TFB HTLs with different TPD-Si$_2$/TFB blend ratios, ranging without limitation from about 3:1 to about 1:3, have been employed, all resulting in PLED device performance comparable to or superior to the PEDOT-based device. Likewise, compositional blends with silanes other than TPD-Si$_2$ and polymers other than TFB, e.g., TAA/TFB blends, TPD-Si$_2$/polystyrene blends, and a silylated TPD or TAA with poly(N-vinylcarbazole), etc., have also been used, in accordance with the broader aspects of this invention, all yielding PLED device performance comparable to or superior to the PEDOT-based device. In addition, these new HTLs have been tested in PLEDs emitting other wavelengths, such as blue-emitting PLEDs based on emissive layers of poly(9, 9-dioctylfluorene) (PFO), yielding comparable enhancement in the corresponding PLED performance. Regardless, the electric properties (e.g., HOMO level) of such compositions can be tuned by blending different polymeric components with various silylated components to approximate or match the electric properties of an emissive layer polymer. Likewise, the amount of the silylated component used can be varied to adjust siloxane bonding with an anode substrate for intermolecular cross-linking to afford strong substrate adhesion and render the resulting film insoluble to spincoat solvents.

Example 7

Solubility test of TPDSi$_2$+TFB blend films.

The optical absorption spectrum of a TPDSi$_2$+TFB blend (1:1 mass ratio) film was recorded using a Varian Cary 1E UV-Visible spectrophotometer. Xylenes (~1 mL, the solvent for EML spin-coating) were spin-coated on a TPDSi$_2$+TFB blend film prepared by the aforementioned procedure, followed by drying in a vacuum oven at 90° C. for 5 min. The optical absorption spectra of the same TPDSi$_2$+TFB blend film before and after xylene spin-coating were measured versus the same blank substrate, using the same spectrometer and the same instrumental setup, and compared.

Example 8

PLED device fabrication. Two series of PLED devices were fabricated using TPDSi$_2$ SAMs, the blend HTLs, and the double-layer HTLs. PLEDs based on PEDOT-PSS were also fabricated as controls. The first series using TFB+BT (1:4) blend as the EML will be referred to as the TFB +BT-based series; the device structure is ITO/HTL/TFB+BT (1:4) blend (70 nm)/Ca (10 nm)/Al (100 nm). The second device series using BT as the EML will be referred to as the BT-based series; the device structure is ITO/HTL/BT (70 nm)/Ca (10 nm)/Al (100 nm). The structures investigated are summarized in FIG. 2. EMLs were spin-coated onto HTL-coated substrates from xylene solutions to afford an EML thickness of ~70 nm as measured by step profilometry. The resultant films were then dried in a vacuum oven at ~90° C. overnight, and then taken into the glove box. Inside an inert atmosphere glove box, Ca was thermally evaporated onto the EML under a vacuum of <10$^{-6}$ Torr, using a shadow mask to define the electrode area as 10 mm$^2$, and followed by Al deposition as a protective layer. The resulting PLED devices were characterized inside a sealed aluminum sample container under a dry nitrogen atmosphere using a computer-controlled Keithley 2400 source meter and an IL 1700 Research Radiometer equipped with a calibrated silicon photodetector.

Example 9

Hole-only device fabrication. A series of hole-only devices of structure ITO/HTL/TFB (75 nm)/Au (14 nm)/Al (120 nm) were also fabricated using the deposition procedures described. The I-V responses of the present hole-only devices were characterized on a probe station using the same computer-controlled Keithley 2400 source meter.

Example 10

Surface characterization results for TPDSi$_2$ SAMs and TPDSi$_2$+TFB blend films on ITO or on PEDOT-PSS-coated ITO substrates. Device response characteristics of PLEDs based on the TPDSi$_2$ SAM, the TPDSi$_2$+TFB blend HTL, and the double-layer HTL (FIG. 2) are compared using EMLs with predominant electron transport or balanced hole and electron transports. PLED devices using conventional PEDOT-PSS HTLs were also fabricated and examined as controls. Finally, the hole-injection capacities of various HTLs are evaluated and compared using hole-only devices.

Example 10a

Characterization of TPDSi$_2$ SAMs. UPS characterization of the TPDSi$_2$ SAM-modified ITO showed that the IP for the covalently attached triarylamine is ca. 5.2 eV (FIG. 3), and that the HOMO median energy is ca. 6.1 eV, after correction for shifts in vacuum level introduced by this molecular modifier. The vacuum level shift/interface dipole creation upon TPDSi$_2$ SAM modification is determined to be ~+0.1 eV, which should, in principle, reduce the intrinsic hole injection barrier and hence enhance hole injection. In contrast, the work function of bare ITO is found to be 4.5 eV, in general agreement with literature values.

X-ray reflectivity (XRR) measurements on the TPDSi$_2$ SAM deposited on single-crystal Si (111) substrates yield a thickness of 1.77 nm (close to the value of ~1.44nm estimated by the approximate AM1-level calculations, FIG. 1), suggesting that most TPDSi$_2$ molecules are chemisorbed on the substrate in an approximately "upright" orientation (FIG. 1).

The advancing aqueous contact angle of the TPDSi$_2$ SAM-modified ITO is 80°, while the relevant angles for clean ITO, ITO/PEDOT-PSS, and TFB surfaces are 0-20°, 30°, and 90°, respectively. It is generally accepted in the art that electron-transport layer surface energy matching plays an important role in the response properties of organic LEDs. The surface energy mismatch between hydrophilic ITO and a hydrophobic polymer is likely to cause poor physical-electronic contact at the ITO/polymer interface and hence inefficient anode hole injection as well as thermal instability. Modification of ITO anodes with TPDSi$_2$ SAMs reduces the surface energy mismatch at the ITO/polymer interface and is likely to facilitate PLED anode hole injection, since previous work indicated that it enhances hole injection into small-molecule hole transport structures.

Example 10b

Figure 4:
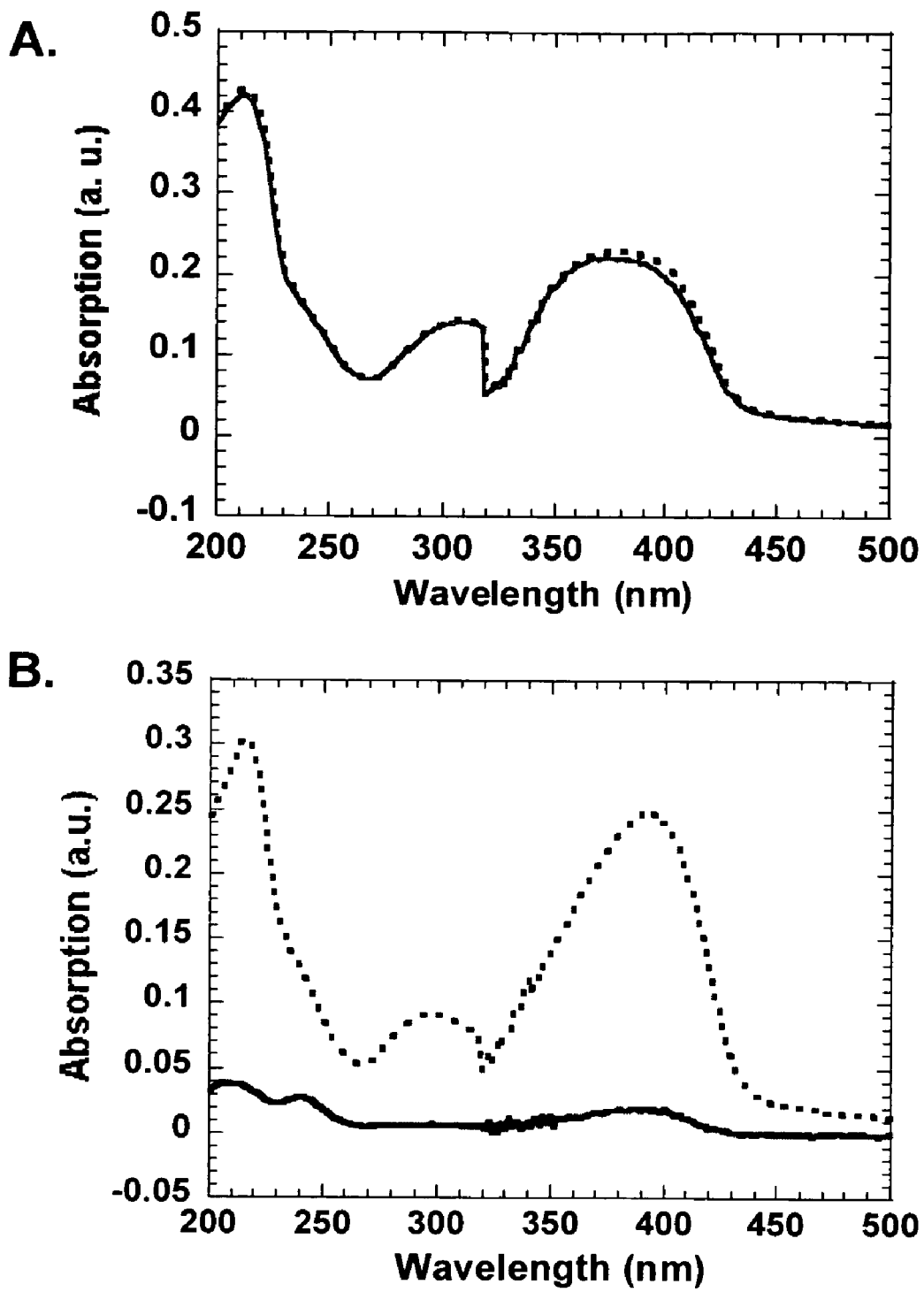
FIG. 4. Optical absorption of: A. $TPDSi_2$+TFB HTL. B. TFB-only film, before and after the xylene solubility test. Symbols: dotted line, before rinsing; solid line, after rinsing.

Characterization of TPDSi$_2$+TFB blends on ITO. The optical absorption spectra of TPDSi$_2$+TFB (1:1 mass ratio) blend films on ITO substrates were recorded before and after rinsing with xylene. FIG. 4A shows that after spin-coating xylene (the solvent for deposition of the EML) onto the crosslinked TPDSi$_2$+TFB HTL, the optical absorption of the TPDSi$_2$+TFB film remains essentially unchanged, indicating insolubility of the cured TPDSi$_2$+TFB blend under the conditions incurred on spin-coating the EML. However, without the crosslinkable TPDSi$_2$ in the blend, the TFB-only HTL is readily dissolved by xylene spin-coating (FIG. 4B).

Figure 5:
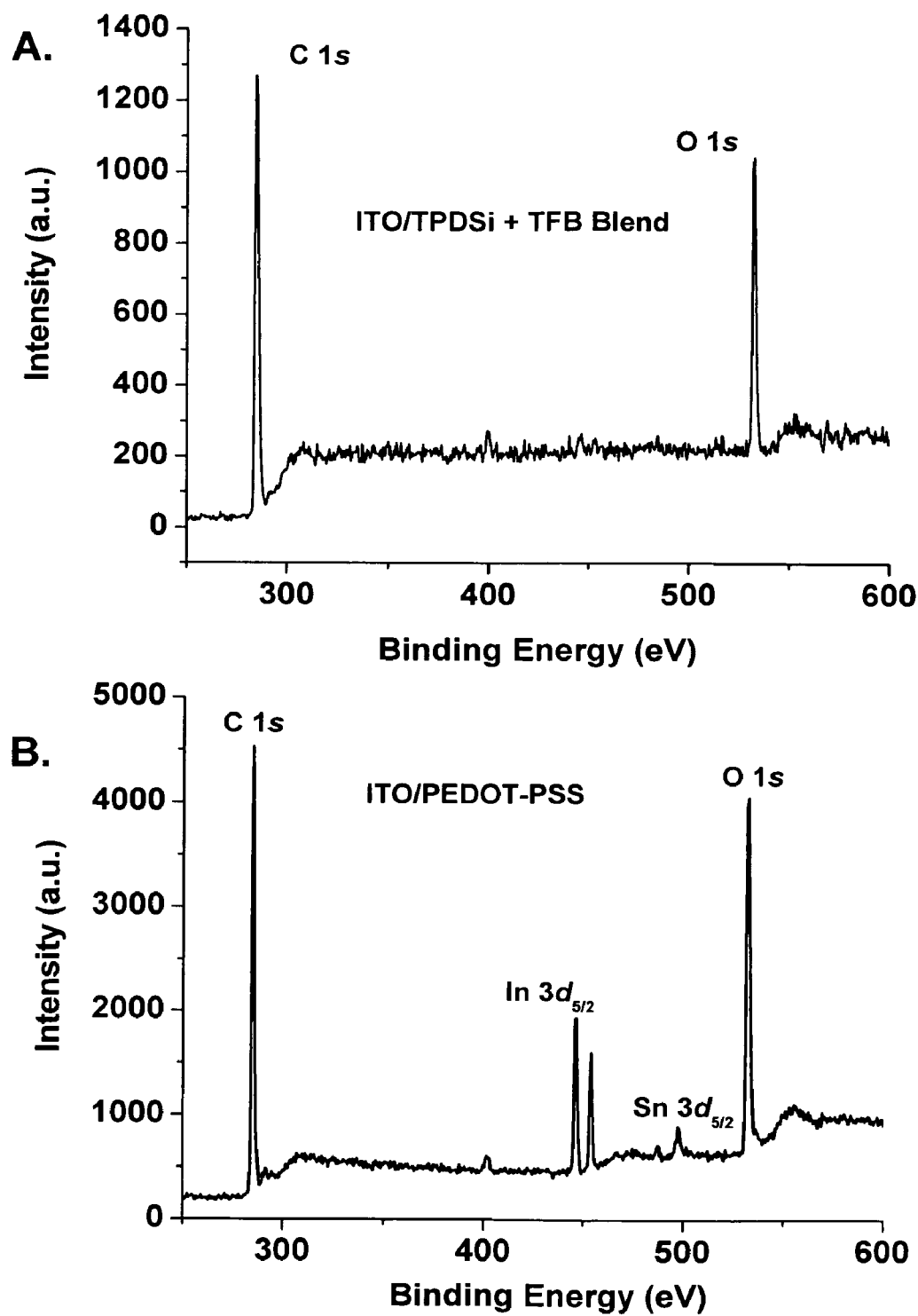
FIG. 5. XPS spectra of A. ITO/$TPDSi_2$+TFB Blend and B. ITO/PEDOT-PSS using 1486.6 eV monochromated Al Kα radiation with an operating power of 300 W.

The composition of the TPDSi$_2$+TFB blend films was also investigated by XPS. A significant issue for conventional PLED HTLs such as PEDOT-PSS is that its solutions have a pH value of ~1, and ITO is known to be sensitive to corrosion by aqueous acids. Indeed, PEDOT-PSS has been shown to undergo reaction with ITO and to introduce indium contamination into the HTL and EML structures. Here, XPS was used to study the film compositions of PEDOT-PSS and the TPDSi$_2$+TFB blend on ITO substrates after casting, then heating in an oven (120° C.) under air for one week. The final indium composition in PEDOT-PSS is determined to be ~1.5%, while that in the TPDSi$_2$+TFB film is below the instrumental detection limit (<0.05 atom % for indium). The XPS spectra of PEDOT-PSS and TPDSi$_2$+TFB blend films on ITO are compared in FIG. 5.

A similar solubility test verifies that the TPDSi$_2$+TFB blend on the PEDOT-PSS-coated ITO is also insoluble under the xylene spin-coating procedure. Furthermore, XPS measurements verify that there is negligible indium contamination in the TPDSi$_2$+TFB blend film on PEDOT-PSS-coated ITO after heating under air at 120° C. for one week.

Example 11

Surface morphology study. With reference to the schematic illustrations of FIG. 2, the surface morphologies of TPDSi$_2$ SAMs (film 1), the TPDSi$_2$+TFB blend HTL (film 2), the double-layer HTL (film 3), the PEDOT-PSS HTL (film 4), and bare ITO substrates (film 5) were studied by contact mode AFM. The RMS roughness of the present ITO substrates was determined by AFM to be 3.0-4.0 nm. The RMS roughnesses of films 1,2,3, and 4 were determined to be 3.9 nm, 1.7 nm, 1.0 nm, and 1.1 nm, respectively, while the film thicknesses of films 1,2,3, and 4 were determined by surface profilometry to be 1.8 nm, 15 nm, 60 nm, and 45 nm respectively. Thus, it can be clearly seen that the TPDSi$_2$ SAM provides conformal coverage of the TPDSi$_2$ molecules on the ITO but has no significant planarization effects. In contrast, the blend HTL achieves considerable planarization on ITO, while the planarization imparted by the double-layer HTL and the PEDOT-PSS HTL are greater still.

Example 12

Response comparison of PLED devices based on films 1,2,3, and 4 with the TFB+BT blend as the EML. The response characteristics of BT-based PLEDs fabricated on films 1,2,3, and 4 are compared in FIGS. 6A and 6B for luminance-voltage (L-V) and current efficiency-voltage (CE-V) properties, respectively. The double-layer HTL-based device (ITO/PEDOT-PSS/TPDSi$_2$+TFB blend) exhibits the most impressive performance: it turns on at ~2.3 V and reaches a maximum current efficiency of ~17 cd/A at 5-6 V. The double-layer HTL and the blend HTL-based devices can withstand current densities as high as 2 A/cm$^2$, and at this current density level, the device exhibits maximum luminance of ~140,000 cd/m$^2$ and still exhibits current efficiencies as high as 13 cd/A. Compared to the control device with PEDOT-PSS as the HTL, the present double-layer HTL and blend HTL-based devices exhibit 70% and 40% greater current efficiencies, respectively, and 2-fold greater maximum light output.

Example 13

Hole injection capacity comparison of structures 1,2,3,4, and 5 as assessed by hole-only devices. The current density vs. electric field characteristics of TFB-based hole-only devices fabricated with films 1,2,3,4, and 5 are compared in FIG. 7. The hole injection fluence of devices based on structures 1,2,3, and 4 are 50-200-fold greater than that of a bare ITO-based device. These data show that TPDSi$_2$ SAM, the blend HTL, and the double-layer HTL all provide ~100-fold greater hole injection compared to bare ITO anodes and comparable hole injection compared to the PEDOT-PSS HTL.

Example 14

Response comparison of devices based on structures 1,2, 3,4, and 5 with BT as the EML. As implied by its HOMO and LUMO energies (FIG. 3), BT is a highly electron-dominated emissive polymer. Therefore, in a BT/Ca-based PLED device, there is a substantial cathode-originating electron current reaching the HTL/EML interface, and a BT/Ca-based PLED device is therefore a convenient model to assess the electron-blocking properties of an HTL at the HTL/EML interface. The response characteristics of BT-based devices using structures 1,2,3,4, and 5 are compared in FIGS. 8A, 8B, and 8C, for luminance-voltage (L-V), current efficiency-voltage (CE-V), and current density-voltage (I-V) responses, respectively. The turn-on voltages of the present BT-based devices fabricated with films 1,2,3,4, and 5 are 3.1, 3.5, 4.3, 5.5, and 10 V, respectively (turn-on voltage is defined as the voltage required for a device to reach a luminance of ~1 cd/m$^2$). The most efficient blend HTL-based device achieves a current efficiency of 10-11 cd/A in the 6-8 V range, while the most efficient double-layer HTL-based device exhibits a current efficiency of 15-17 cd/A in the 6-8 V range. These values of maximum current efficiency are ~1000-fold greater than that of the bare ITO-based device. Furthermore, compared to the device with PEDOT-PSS alone as the HTL, the present blend HTL and double-layer HTL-based devices achieve ~10-fold greater current efficiency, clearly a result of effective electron-blocking at the HTL/EML interface.

We claim:

1. A hole transport composition comprising a polymeric hole transport component and a silylated aryl amine component of a formula selected from

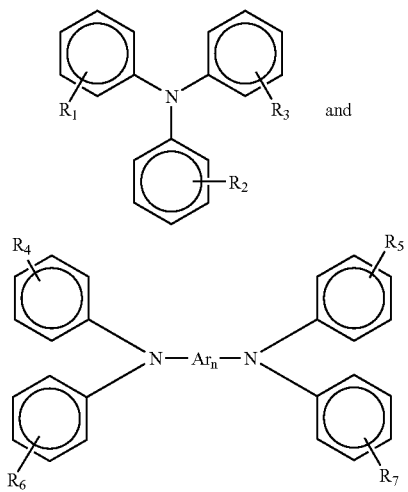

where Ar is arylene; n is an integer ranging from 1 to 4; $R_1$-$R_7$ are independently selected from H and alkyl moieties ranging from $C_1$ to $C_6$, each said moiety comprising a hydrolyzable silyl group, and wherein at least one of $R_1$-$R_3$ and at least one of $R_4$-$R_7$ is one of said alkyl moieties; and wherein the hydrolyzable silyl group comprises three hydrolyzable groups bonded to silicon.

2. The composition of claim 1 wherein $R_1$-$R_7$ are selected from a $C_1$-$C_6$ alkyl moiety comprising a group selected from trihalosilyl and trialkoxysilyl.

3. The compound of claim 2 wherein Ar is phenylene and n is 2.

4. The compound of claim 2 wherein $R_1$-$R_7$ are independently selected from trihalosilylalkyl and trialkoxysilylalkyl moieties.

5. The compound of claim 4 wherein one of $R_1$-$R_3$ is a trichlorosilylpropyl moiety, and one of $R_4$-$R_7$ is a trichlorosilylpropyl moiety.

6. The composition of claim 5 wherein Ar is phenylene and n is 2.

7. The composition of claim 2 wherein said polymeric component is selected from TFB, BT and combinations thereof.

8. The composition of claim 1 wherein said polymeric component is a poly(fluorene).

9. The composition of claim 7 wherein said polymeric component is selected from TFB, BT and combinations thereof.

10. The composition of claim 9 wherein said silylated aryl amine component is selected from a trisilylated triphenylamine compound and TPDSi$_2$.

11. The composition of claim 1, wherein $R_1$-$R_7$ are selected from a $C_1$-$C_6$ alkyl moiety comprising a group selected from trihalosilyl, trialkoxysilyl, dialkoxyhalosilyl, and dihaloalkoxysilyl.

12. A hole transport composition comprising a polymeric component selected from TFB, BT and combinations thereof; and a silylated aryl amine component of a formula

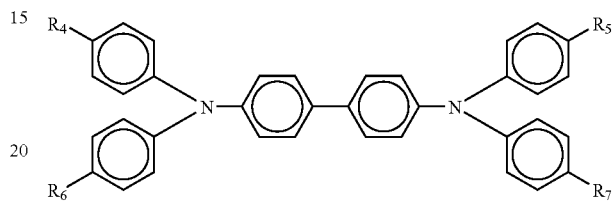

where $R_4$-$R_7$ are independently selected from H and alkyl moieties ranging from $C_1$ about $C_6$, each said alkyl moiety further comprising a hydrolyzable silyl group, and wherein at least one of $R_4$-$R_7$ is one of said alkyl moieties.

13. The composition of claim 12 wherein each of $R_4$-$R_7$ comprises a $C_2$-$C_4$ alkyl moiety.

14. The composition of claim 12, wherein said polymeric component comprises TFB.

15. The composition of claim 14, wherein each of $R_4$ and $R_5$ is H, and each of $R_6$ and $R_7$ comprises a $C_2$-$C_4$ alkyl moiety.

16. The composition of claim 15, wherein said aryl amine component is TPDSi$_2$.

17. A hole transport composition comprising a polymeric hole transport component and a silylated aryl amine component of a formula selected from

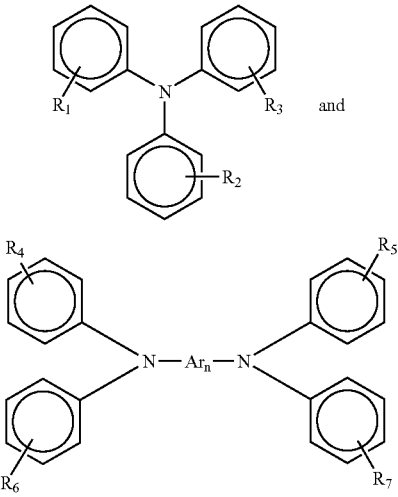

where Ar is arylene; n is an integer ranging from 1 to 4; $R_1$-$R_7$ are independently selected from H and alkyl moieties ranging from $C_1$ to $C_6$, each said moiety comprising a hydrolyzable silyl group, and wherein at least one of $R_1$-$R_3$ and at least one of $R_4$-$R_7$ is one of said alkyl moieties;

and wherein said polymeric component is a poly(fluorene).

* * * * *

UNITED STATES PATENT AND TRADEMARK OFFICE
CERTIFICATE OF CORRECTION

PATENT NO.      : 7,449,509 B2
APPLICATION NO. : 11/009883
DATED           : November 11, 2008
INVENTOR(S)     : Tobin J. Marks et al.

Page 1 of 1

It is certified that error appears in the above-identified patent and that said Letters Patent is hereby corrected as shown below:

In the Specification:

Column 1, lines 7-9
"The United States government has certain rights to this invention pursuant to Grant No. DMR-0076097 from the National Science Foundation to Northwestern University." should read
--This invention was made with government support under DMR-0076097 awarded by the National Science Foundation. The government has certain rights in the invention.--

Signed and Sealed this
Twenty-sixth Day of August, 2014

Michelle K. Lee
*Deputy Director of the United States Patent and Trademark Office*